United States Patent
Miyahira et al.

(10) Patent No.: US 9,232,648 B2
(45) Date of Patent: Jan. 5, 2016

(54) MOLYBDENUM COMPOUND POWDER, PREPREG, AND LAMINATE

(75) Inventors: Tetsuro Miyahira, Tokyo (JP); Yoshihiro Kato, Tokyo (JP); Takaaki Ogashiwa, Tokyo (JP); Hiroshi Takahashi, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 0 days.

(21) Appl. No.: 14/347,075

(22) PCT Filed: Sep. 12, 2012

(86) PCT No.: PCT/JP2012/073313
§ 371 (c)(1),
(2), (4) Date: Jun. 3, 2014

(87) PCT Pub. No.: WO2013/047203
PCT Pub. Date: Apr. 4, 2013

(65) Prior Publication Data
US 2014/0308489 A1  Oct. 16, 2014

(30) Foreign Application Priority Data
Sep. 26, 2011 (JP) .................... 2011-208981

(51) Int. Cl.
| | | |
|---|---|---|
| B32B 3/02 | (2006.01) |
| H05K 1/03 | (2006.01) |
| C01G 39/00 | (2006.01) |
| C01G 39/02 | (2006.01) |
| C08J 5/24 | (2006.01) |
| C08K 9/02 | (2006.01) |
| C08L 63/00 | (2006.01) |
| C09C 1/00 | (2006.01) |
| C08L 71/12 | (2006.01) |
| B32B 27/20 | (2006.01) |

(52) U.S. Cl.
CPC .............. *H05K 1/0373* (2013.01); *B32B 27/20* (2013.01); *C01G 39/00* (2013.01); *C01G 39/02* (2013.01); *C08J 5/24* (2013.01); *C08K 9/02* (2013.01); *C08L 63/00* (2013.01); *C08L 71/12* (2013.01); *C09C 1/0003* (2013.01); *C01P 2004/61* (2013.01); *C01P 2004/62* (2013.01); *C01P 2004/84* (2013.01); *Y10T 428/24893* (2015.01); *Y10T 428/256* (2015.01)

(58) Field of Classification Search
CPC .................. Y10T 428/256; Y10T 428/24893; H05K 1/0373; C01G 39/00; C01G 39/02; C08L 63/00; C08L 71/12; C09C 1/0003
See application file for complete search history.

(56) References Cited

U.S. PATENT DOCUMENTS

| | | |
|---|---|---|
| 3,871,894 A | 3/1975 | Kubo et al. |
| 3,942,998 A | 3/1976 | Higgins |
| 4,455,174 A | 6/1984 | Wienand et al. |
| 4,752,460 A | 6/1988 | Herren |
| 6,190,787 B1 | 2/2001 | Maeda et al. |
| 2008/0187763 A1 | 8/2008 | Kato et al. |
| 2012/0111621 A1 | 5/2012 | Ohigashi et al. |

FOREIGN PATENT DOCUMENTS

| | | |
|---|---|---|
| EP | 1925592 | 5/2008 |
| JP | 51-73000 | 6/1976 |
| JP | 57-190080 | 11/1982 |
| JP | 11-302501 | 11/1999 |
| JP | 2000-154320 | 6/2000 |
| JP | 2002-160907 | 6/2002 |
| JP | 2004-59643 | 2/2004 |
| JP | 2007-138075 | 6/2007 |
| JP | 2008-214602 | 9/2008 |
| JP | 2009-120702 | 6/2009 |
| JP | 2011-105911 | 6/2011 |
| JP | 2011-137054 | 7/2011 |

OTHER PUBLICATIONS

Search report from International Patent Appl. No. PCT/JP2012/073313, mail date is Oct. 16, 2012.

*Primary Examiner* — Elizabeth Mulvaney
(74) *Attorney, Agent, or Firm* — Greenblum & Bernstein, P.L.C.

(57) ABSTRACT

The present invention provides a novel surface-treated molybdenum compound powder and provides a prepreg, a laminate, a metal foil laminate, a printed wiring board, and the like that have a low thermal expansion coefficient in the planar direction, and excellent drillability, heat resistance, and flame retardancy. The surface-treated molybdenum compound powder of the present invention has at least part of the surface thereof coated with an inorganic oxide, and this is used as a filler.

21 Claims, No Drawings

MOLYBDENUM COMPOUND POWDER, PREPREG, AND LAMINATE

TECHNICAL FIELD

The present invention relates to a novel molybdenum compound powder, a resin composition and a prepreg using the same, and a laminate and a metal foil-clad laminate using the prepreg.

BACKGROUND ART

In recent years, higher integration, higher functionality, and higher density mounting of semiconductors widely used in electronic equipment, communication instruments, personal computers, and the like have been increasingly accelerated. Therefore, the demand for higher performance of a thermal expansion coefficient, drillability, heat resistance, flame retardancy, and the like in laminates for semiconductor plastic packages has increased more than ever before.

In addition to these, a reduction in the thermal expansion coefficient of the laminate in the planar direction has been strongly required, particularly in recent years. This is because, if the difference in thermal expansion coefficient between a semiconductor device and a printed wiring board for a semiconductor plastic package is large, when a thermal shock is applied, warpage occurs in the semiconductor plastic package due to the difference in the thermal expansion coefficient, and poor connection occurs between the semiconductor device and the printed wiring board for a semiconductor plastic package, and between the semiconductor plastic package and the mounted printed wiring board.

Conventionally, methods of relatively highly blending an inorganic filler in a resin composition in order to decrease the thermal expansion coefficient while satisfying various properties required of a laminate have been known (for example, see Patent Literatures 1 and 2). However, a problem of these methods is that the cured product of the resin composition is hard and brittle, and therefore, when a laminate obtained using this is drilled, the drillability is worsened, for example, the hole position precision decreases, the drill bit wears quickly and thus the frequency of the replacement of the drill bit increases, and the breakage of the drill bit is likely to occur.

On the other hand, as methods for improving the drillability of a laminate, methods of blending a molybdenum compound, such as zinc molybdate or calcium molybdate, in a resin composition have been known (for example, see Patent Literature 3).

CITATION LIST

Patent Literature

Patent Literature 1: Japanese Patent Laid-Open No. 2004-059643
Patent Literature 2: Japanese Patent Laid-Open No. 2009-120702
Patent Literature 3: Japanese Patent Laid-Open No. 2011-137054

SUMMARY OF INVENTION

Technical Problem

However, as described in Patent Literature 3, a problem is that when particles of a molybdenum compound are simply blended in a resin composition, the heat resistance of the cured product of the resin composition decreases.

The present invention has been made in view of the above problems, and it is an object of the present invention to provide a novel surface-treated molybdenum compound powder useful, for example, as a filler of a resin composition, and a resin composition using the same, and a prepreg.

It is another object of the present invention to provide a laminate, a metal foil-clad laminate, and a printed wiring board that have a low thermal expansion coefficient in the planar direction, have relatively excellent drillability and heat resistance though an inorganic filler is blended, and further also have excellent flame retardancy.

Solution to Problem

The present inventors have studied diligently for solving such problems, and, as a result, found that the above problems are solved by using a surface-treated molybdenum compound powder having at least part of the surface thereof coated with an inorganic oxide, thus arriving at the present invention.

Specifically, the present invention provides the following <1> to <21>.

<1> A surface-treated molybdenum compound powder having at least part of a surface thereof coated with an inorganic oxide.

<2> The surface-treated molybdenum compound powder according to the above <1>, comprising:
a core particle comprising a molybdenum compound; and
the inorganic oxide formed on at least part of a surface of the core particle.

<3> The surface-treated molybdenum compound powder according to the above <1> or <2>, wherein the molybdenum compound is at least one selected from the group consisting of zinc molybdate, molybdenum trioxide, ammonium molybdate, and a molybdenum hydrate.

<4> The surface-treated molybdenum compound powder according to any one of the above <1> to <3>, wherein the inorganic oxide is at least one selected from the group consisting of silica, titania, alumina, and zirconia.

<5> The surface-treated molybdenum compound powder according to any one of the above <1> to <4>, wherein the inorganic oxide has a thickness of 3 to 500 nm.

<6> The surface-treated molybdenum compound powder according to any one of the above <2> to <5>, wherein the core particle has an average particle diameter of 0.1 to 30 μm.

<7> A filler comprising the surface-treated molybdenum compound powder according to any one of the above <1> to <6>.

<8> A resin composition comprising the surface-treated molybdenum compound powder according to any one of the above <1> to <6> (A), an epoxy resin (B), a curing agent (C), and an inorganic filler (D).

<9> The resin composition according to the above <8>, wherein a content of the surface-treated molybdenum compound powder (A) is 0.2 to 30 parts by mass based on 100 parts by mass of a total of resin solid components.

<10> The resin composition according to the above <8> or <9>, wherein the curing agent (C) is at least one selected from the group consisting of a cyanate ester compound, a phenolic resin, and a BT resin.

<11> The resin composition according to the above <10>, wherein the cyanate ester compound is a naphthol aralkyl-based cyanate ester compound represented by the following general formula (8) and/or a phenol novolac-based cyanate ester compound represented by the following general formula (9):

[Formula 1]

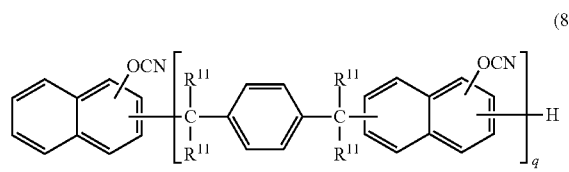
(8)

wherein R¹¹ each independently represents a hydrogen atom or a methyl group, and q represents an integer of 1 or more;

[Formula 2]

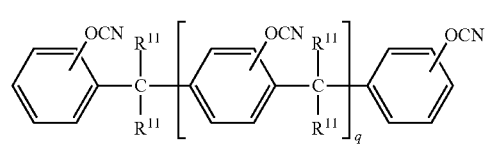
(9)

wherein R¹¹ each independently represents a hydrogen atom or a methyl group, and q represents an integer of 1 or more.

<12> The resin composition according to the above <10>, wherein the phenolic resin is at least one selected from the group consisting of a cresol novolac-based phenolic resin, an aminotriazine novolac-based phenolic resin, a naphthalene-based phenolic resin, a naphthol aralkyl-based phenolic resin represented by the following general formula (10), and a biphenyl aralkyl-based phenolic resin represented by the following general formula (11):

[Formula 3]

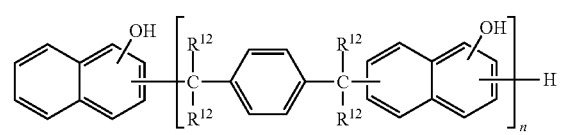
(10)

wherein R¹² each independently represents a hydrogen atom or a methyl group, and n represents an integer of 1 or more:

[Formula 4]

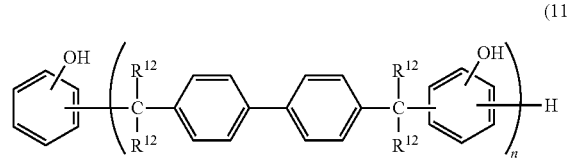
(11)

wherein R¹² each independently represents a hydrogen atom or a methyl group, and n represents an integer of 1 or more.

<13> The resin composition according to the above <12>, wherein the phenolic resin is a naphthol aralkyl-based phenolic resin represented by the following general formula (10) and/or a biphenyl aralkyl-based phenolic resin represented by the following general formula (11):

[Formula 5]

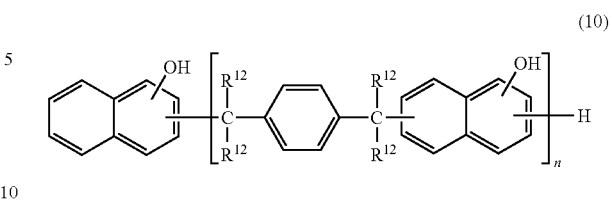
(10)

wherein R¹² each independently represents a hydrogen atom or a methyl group, and n represents an integer of 1 or more;

[Formula 6]

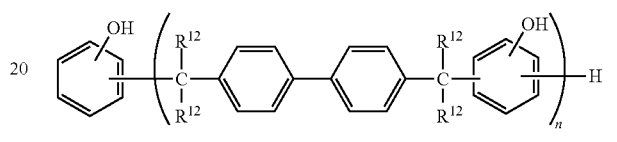
(11)

wherein R¹² each independently represents a hydrogen atom or a methyl group, and n represents an integer of 1 or more.

<14> The resin composition according to any one of the above <8> to <13>, wherein the epoxy resin (B) is an epoxy resin represented by the following general formula (1) and/or the following general formula (3a):

[Formula 7]

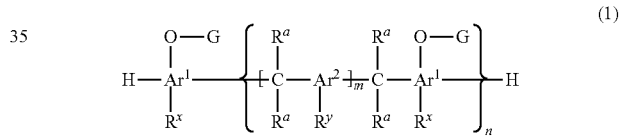
(1)

wherein herein $Ar^1$ and $Ar^2$ each independently represent an aryl group which is a substituent derived from a monocyclic or polycyclic aromatic hydrocarbon that is a phenyl group, a naphthyl group, or a biphenyl group, $R^a$ each independently represents a hydrogen atom or a methyl group, $R^x$ and $R^y$ each independently represent a hydrogen atom, an alkyl group, or an aryl group, m represents an integer of 1 to 5, n represents an integer of 1 to 50, and G represents a glycidyl group:

[Formula 8]

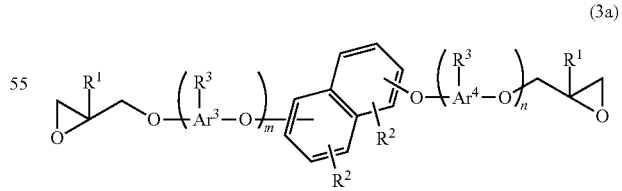
(3a)

wherein $R^1$ each independently represents a hydrogen atom or a methyl group, $Ar^3$ and $Ar^4$ each independently represent a naphthylene group or a phenylene group, both groups may each have an alkyl group having 1 to 4 carbon atoms or a phenylene group as a substituent, $R^2$ each independently represents a hydrogen atom, an alkyl group having 1 to 4 carbon atoms, or an aralkyl group represented by the following general formula (4), m and n are each independently an integer of 0 to 4 provided that either one of m and n is 1 or more, $R^3$ each independently represents a hydrogen atom, an aralkyl group represented by the following general formula (4), or an epoxy group-containing aromatic hydrocarbon group represented by the following general formula (5), where in the above general formula (3a), a bonding position to a naphthalene structure part may be either of two benzene rings constituting the naphthalene structure part;

[Formula 9]

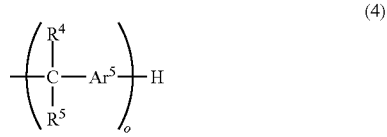

(4)

wherein $R^4$ and $R^5$ each independently represent a hydrogen atom or a methyl group, $Ar^5$ represents a phenylene group, a phenylene group or a naphthylene group in which 1 to 3 hydrogen atoms are each nucleus-replaced by an alkyl group having 1 to 4 carbon atoms, or a naphthylene group in which 1 to 3 hydrogen atoms are each nucleus-replaced by an alkyl group having 1 to 4 carbon atoms, and o is a number of 0.1 to 4 on average;

[Formula 10]

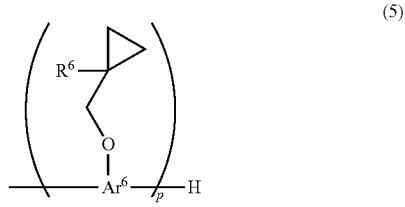

(5)

wherein $R^6$ represents a hydrogen atom or a methyl group, $Ar^6$ represents a naphthylene group or a naphthylene group having an alkyl group having 1 to 4 carbon atoms, an aralkyl group, or a phenylene group as a substituent, and p is an integer of 1 or 2.
<15> The resin composition according to any one of the above <8> to <14>, further comprising a maleimide compound (E).
<16> The resin composition according to any one of the above <8> to <15>, wherein a content of the epoxy resin (B) is 5 to 60 parts by mass based on 100 parts by mass of the total of the resin solid components.
<17> The resin composition according to any one of the above <8> to <16>, wherein a content of the curing agent (C) is 10 to 70 parts by mass based on 100 parts by mass of the total of the resin solid components.
<18> A prepreg obtained by impregnating or coating a substrate with the resin composition according to any one of the above <8> to <17>.
<19> A laminate obtained by laminating and molding the prepreg according to the above <18>.
<20> A metal foil-clad laminate obtained by laminating and molding the prepreg according to the above <18> and a metal foil.
<21> A printed wiring board comprising an insulating layer and a conductor layer formed on a surface of the insulating layer, wherein the insulating layer comprises the resin composition according to any one of the above <8> to <17>.

Advantageous Effects of Invention

According to the present invention, a novel surface-treated molybdenum compound powder useful, for example, as a filler of a resin composition, and a resin composition and a prepreg using the same can be realized. By using this surface-treated molybdenum compound powder as a filler of a resin composition, relatively high drillability and heat resistance are maintained, and therefore, a laminate, a metal foil laminate, a printed wiring board, and the like that have a low thermal expansion coefficient in the planar direction, excellent drillability and heat resistance, and further also excellent flame retardancy can be realized simply and with good reproducibility.

Therefore, according to the present invention, a laminate and the like in which the various performance is achieved at a high level though an inorganic filler is blended can be provided. In addition, a novel and high performance material especially useful in semiconductor package applications and the like in which such various properties are required can be provided.

DESCRIPTION OF EMBODIMENTS

Embodiments of the present invention will be described below. The following embodiments are illustrations for explaining the present invention, and the present invention is not limited only to the embodiments.
(Surface-Treated Molybdenum Compound Powder)
A surface-treated molybdenum compound powder in this embodiment has in least part of the surface thereof coated with an inorganic oxide. More specifically, the surface-treated molybdenum compound powder in this embodiment has a core particle comprising a molybdenum compound, and an inorganic oxide formed on at least part of the surface of this core particle.

The surface-treated molybdenum compound powder in this embodiment is a set of molybdenum compound particles on the surfaces of which an inorganic oxide is provided, and not only the heat resistance is increased by the inorganic oxide present on the particle surfaces, but the molybdenum compound of the core particles effectively acts on drilling and the like. Therefore, by using this surface-treated molybdenum compound powder, for example, as a filler for a laminate or the like, both two conflicting properties, drillability and heat resistance, which cannot be achieved with the use of a conventional filler, can be achieved at a high level.

The molybdenum compound to be the core particle comprises molybdenum in the molecule. Specific examples of the molybdenum compound include, but are not particularly limited to, molybdenum compounds, such as zinc molybdate (for example, $ZnMoO_4$ and $Zn_3Mo_2O_9$), ammonium molybdate, sodium molybdate, calcium molybdate, potassium molybdate, molybdenum disulfide, molybdenum trioxide, and molybdenum hydrates. One of these can be used alone, or two or more of these can be used in combination. In terms of use as a filler, those that do not function as organometallic catalysts, for example, molybdate compounds, molybdenum oxides, or molybdenum hydrates, are preferred. In terms of achieving both the above-described drillability and heat resistance, zinc molybdate, ammonium molybdate, molybdenum trioxide, and molybdenum hydrates are more preferred.

The average particle diameter (D50) of the core particles comprising the molybdenum compound can be appropriately set according to the desired performance, and is not particularly limited. Considering the above-described drillability and heat resistance and further dispersibility, the average particle diameter (D50) is preferably 0.1 to 30 µm, more preferably 0.5 to 20 µm. Here, the average particle diameter (D50) means a median diameter, and is a value in which the larger side and the smaller side when the measured particle size distribution of a powder is divided into two are equivalent, herein. This average particle diameter (D50) means a value when 50% of the total volume is reached when the particle size distribution of a powder introduced in a predetermined amount into an aqueous dispersion medium is measured by a laser diffraction scattering particle size distribution measuring apparatus and the volumes are summed from a small particle.

The above core particles comprising the molybdenum compound can be manufactured by various known methods, such as a pulverization method and a granulation method, and the method for manufacturing the core particles is not particularly limited. In addition, commercial products of the core particles are commercially easily available.

An inorganic oxide is provided on the surface of the core particle comprising the molybdenum compound, that is, the outer periphery of the core particle. For the inorganic oxide coating the molybdenum compound powder, those having excellent heat resistance are preferred. The type of the inorganic oxide is not particularly limited, and metal oxides are preferred. Specific examples of the metal oxides include, but are not particularly limited to, $SiO_2$, $Al_2O_3$, $TiO_2$, $ZnO$, $In_2O_3$, $SnO_2$, $NiO$, $CoO$, $V_2O_5$, $CuO$, $MgO$, and $ZrO_2$. One of these can be used alone, or two or more of these can be used in combination. Among these, in terms of heat resistance, insulation properties, cost, and the like, silica, titania, alumina, and zirconia are preferred, and silica is more preferred.

Here, the inorganic oxide should be provided on at least part of the surface of the core particle. In other words, the inorganic oxide may be partially provided on the surface of the core particle, or provided so as to cover all the surface of the core particle. On the other hand, in terms of achieving both the above-described drillability and heat resistance, it is preferred that the inorganic oxide is generally uniformly provided so as to cover all the surface of the core particle, that is, a film of the inorganic oxide is generally uniformly formed on the surface of the core particle.

The thickness of the inorganic oxide coating the surface of the core particle comprising the molybdenum compound can be appropriately set according to the desired performance, and is not particularly limited. In terms of forming a uniform film of the inorganic oxide, and further in terms of more significantly exhibiting the effect of improving the above-described drillability, and providing higher heat resistance, the thickness is preferably 3 to 500 nm, more preferably 10 to 200 nm, and further preferably 15 to 100 nm.

The method for manufacturing the surface-treated molybdenum compound powder in this embodiment is not particularly limited. For example, the surface-treated molybdenum compound powder in this embodiment can be obtained by providing an inorganic oxide or a precursor thereof on the surfaces of core particles comprising a molybdenum compound, appropriately using various known methods, such as a sol-gel method, a liquid phase deposition method, an immersion coating method, a spray coating method, a printing method, an electroless plating method, a sputtering method, a vapor deposition method, an ion plating method, and a CVD method. Therefore, the method for providing an inorganic oxide or a precursor thereof on the surfaces of core particles comprising a molybdenum compound may be either a wet method or a dry method.

Examples of preferred methods for manufacturing the surface-treated molybdenum compound powder in this embodiment include a method of dispersing a molybdenum compound powder (core particles) in an alcohol solution in which a metal alkoxide, such as a silicon alkoxide or an aluminum alkoxide, is dissolved, and dropping a mixed solution of water, an alcohol, and a catalyst while stirring the dispersion to hydrolyze the alkoxide to form a film of silicon oxide, aluminum oxide, or the like on the powder surface as a low refractive index film, then subjecting the powder to solid-liquid separation and vacuum drying, and then subjecting the powder to heat treatment as in the above. Examples of other preferred manufacturing methods include a method of dispersing a molybdenum compound powder (core particles) in an alcohol solution in which a metal alkoxide, such as a silicon alkoxide or an aluminum alkoxide, is dissolved, and subjecting the dispersion to mixing treatment at high temperature and low pressure to form a film of silicon oxide, aluminum oxide, or the like on the powder surface, and then subjecting the powder to vacuum drying and crushing treatment. By these methods, a molybdenum compound powder having a film of a metal oxide, such as silica or alumina, on the surface of the powder is obtained.

The surface-treated molybdenum compound powder in this embodiment preferably comprises 85.0 to 99.5% by mass, more preferably 90.0 to 99.5% by mass, and further preferably 95.0 to 99.0% by mass, of the above-described molybdenum compound in terms of forming a uniform film of an inorganic oxide to achieve both the above-described drillability and heat resistance at a higher level. In other words, the surface-treated molybdenum compound powder in this embodiment preferably comprises 0.5 to 15% by mass, more preferably 1.0 to 10.0% by mass, and further preferably 1.0 to 5.0% by mass, of the above-described inorganic oxide.

(Resin Composition)

A resin composition in this embodiment contains at least the above surface-treated molybdenum compound powder (A), an epoxy resin (B), a curing agent (C), and an inorganic filler (D). For the epoxy resin (B), the curing agent (C), and the inorganic filler (D) used here, known ones can be appropriately selected and used according to the intended application and performance, and the type of each material and the amount of each material used are not particularly limited. For example, in the case of electrical and electronic material applications, electrical insulating material applications, machine tool material applications, and adhesive applications, each material can be appropriately selected from various materials known in each technical field.

The content of the surface-treated molybdenum compound powder (A) in the resin composition in this embodiment can be appropriately set according to the intended application and performance, and is not particularly limited. In terms of heat resistance and flame retardancy, the content of the surface-treated molybdenum compound powder (A) is preferably 0.2 to 30 parts by mass, more preferably 1 to 10 parts by mass, based on 100 parts by mass of the total of the resin solid components. The resin solid components here mean the epoxy resin (B) and the curing agent (C), and include all of a maleimide compound (E) described later, and polymer compounds, such as thermosetting resins, thermoplastic resins, and oligomers thereof, and elastomers, other than the above, when these are contained in the resin composition.

For the epoxy resin (B) used in the resin composition in this embodiment, a known one can be appropriately used as long as it is one having two or more epoxy groups in one molecule. The type of the epoxy resin (B) is not particularly limited. Because of an increased interest in environmental problems in recent years, non-halogen-based epoxy resins are preferred. Specific examples thereof include, but are not particularly limited to, bisphenol A-based epoxy resins, bisphenol F-based epoxy resins, bisphenol F-based epoxy resins, bisphenol S-based epoxy resins, bisphenol A novolac-based epoxy resins, phenol novolac-based epoxy resins, cresol novolac-based epoxy resins, biphenyl-based epoxy resins, naphthalene-based epoxy resins, anthracene-based epoxy resins, trifunctional phenol-based epoxy resins, tetrafunctional phenol-based epoxy resins, glycidyl ester-based epoxy resins, phenol aralkyl-based epoxy resins, aralkyl novolac-based epoxy resins, biphenyl aralkyl-based epoxy resins, naphthol aralkyl-based epoxy resins, dicyclopentadiene-based epoxy resins, polyol-based epoxy resins, alicyclic epoxy resins, glycidyl amines, glycidyl esters, compounds obtained by epoxidizing the double bond of butadiene or the like, and compounds obtained by the reaction of hydroxyl group-containing silicone resins with epichlorohydrin.

Among these, for the epoxy resin (B), aralkyl novolac-based epoxy resins represented by the following general formula (1) are preferred in terms of increasing flame retardancy.

[Formula 11]

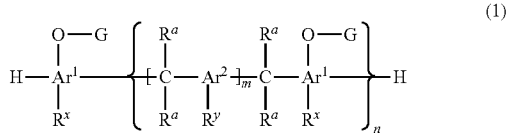

(1)

wherein $Ar^1$ and $Ar^2$ each independently represent an aryl group in which a monocyclic or polycyclic aromatic hydrocarbon, such as a phenyl group, a naphthyl group, or a biphenyl group, is a substituent, $R^a$ each independently represents a hydrogen atom or a methyl group, and $R^x$ and $R^y$ each independently represent a hydrogen atom, an alkyl group, or an aryl group; m represents an integer of 1 to 5, and n represents an integer of 1 to 50; and G represents a glycidyl group.

In addition, among the aralkyl novolac-based epoxy resins represented by the above general formula (1), phenyl aralkyl novolac-based epoxy resins represented by the following general formula (2a), biphenyl aralkyl novolac-based epoxy resins represented by the following general formula (2b), and naphthol aralkyl novolac-based epoxy resins represented by the following general formula (2c) are preferred. Examples of products of the epoxy resins represented by the following general formula (2b) include NC-3000-FH manufactured by Nippon Kayaku Co., Ltd.

[Formula 12]

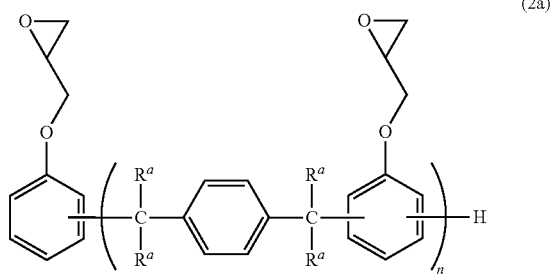

(2a)

wherein $R^a$ each independently represents a hydrogen atom or a methyl group, and n represents an integer of 1 to 50.

[Formula 13]

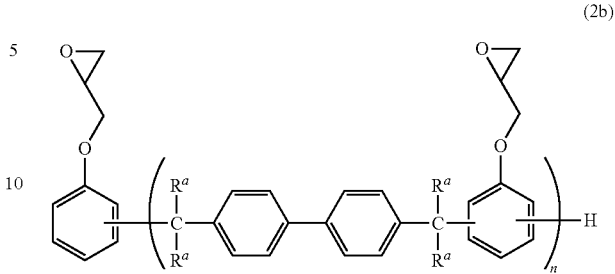

(2b)

wherein $R^a$ each independently represents a hydrogen atom or a methyl group, and n represents an integer of 1 to 50.

[Formula 14]

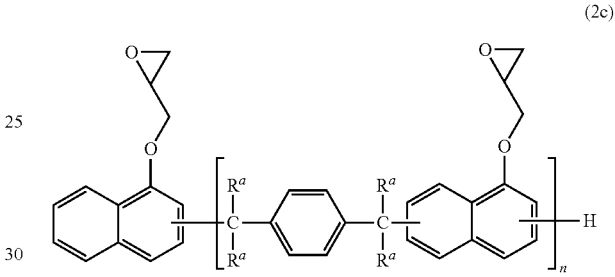

(2c)

wherein $R^a$ each independently represents a hydrogen atom or a methyl group, and n represents an integer of 1 to 50.

On the other hand, in terms of reducing the thermal expansion coefficient, for the epoxy resin (B), epoxy resins having a naphthalene skeleton represented by the following general formula (3a), epoxy resins having an anthracene skeleton represented by the following general formula (3b), and epoxy resins having a dihydroanthracene skeleton represented by the following general formula (3c) are preferred. In addition, among the epoxy resins having a naphthalene skeleton represented by the following general formula (3a), epoxy resins having a naphthalene skeleton represented by the following general formula (6) and/or the following general formula (7) are more preferred. Examples of products of the epoxy resins having a naphthalene skeleton represented by the following general formula (3a) include HP-6000 manufactured by DIC Corporation, EXA-7310 manufactured by DIC Corporation, EXA-7311 manufactured by DIC Corporation, EXA-7311-L manufactured by DIC Corporation, EXA-7311-G3 manufactured by DIC Corporation, and EXA-7311-G4 manufactured by DIC Corporation.

[Formula 15]

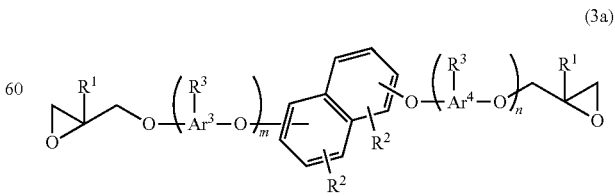

(3a)

wherein $R^1$ each independently represents a hydrogen atom or a methyl group, $Ar^3$ and $Ar^4$ each independently represent a naphthylene group or a phenylene group, and both groups may each have an alkyl group having 1 to 4 carbon atoms or a phenylene group as a substituent; $R^2$ each independently represents a hydrogen atom, an alkyl group having 1 to 4 carbon atoms, or an aralkyl group represented by the following general formula (4), m and n are each independently an integer of 0 to 4 provided that either one of m and n is 1 or more, and $R^3$ each independently represents a hydrogen atom, an aralkyl group represented by the following general formula (4), or an epoxy group-containing aromatic hydrocarbon group represented by the following general formula (5); and in the above general formula (3a), the bonding position to a naphthalene structure site may be either of two benzene rings constituting the naphthalene structure site.

[Formula 16]

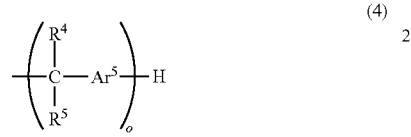

(4)

wherein $R^4$ and $R^5$ each independently represent a hydrogen atom or a methyl group, and $Ar^5$ represents a phenylene group, a naphthylene group or a naphthylene group in which 1 to 3 hydrogen atoms are each nucleus-replaced by an alkyl group having 1 to 4 carbon atoms, or a naphthylene group in which 1 to 3 hydrogen atoms are each nucleus-replaced by an alkyl group having 1 to 4 carbon atoms; and o is a number of 0.1 to 4 on average.

[Formula 17]

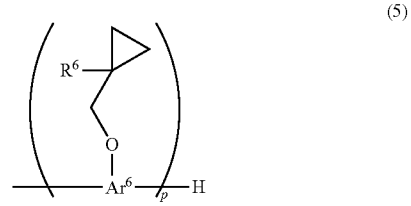

(5)

wherein $R^6$ represents a hydrogen atom or a methyl group, $Ar^6$ represents a naphthylene group or a naphthylene group having an alkyl group having 1 to 4 carbon atoms, an aralkyl group, or a phenylene group as a substituent, and p is an integer of 1 or 2.

[Formula 18]

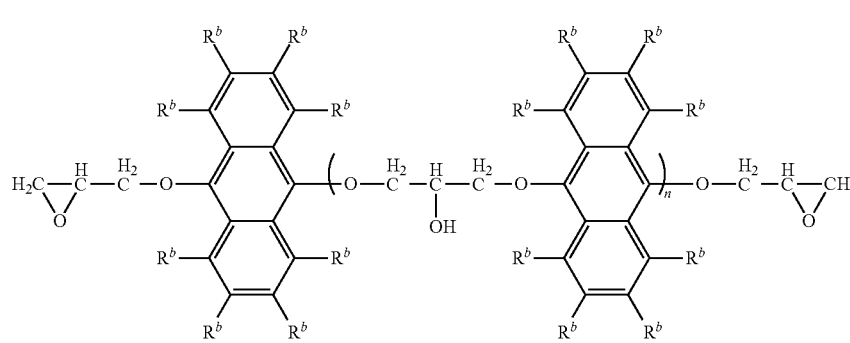

(3b)

wherein $R^b$ each independently represents a hydrogen atom or an alkyl group having 1 to 7 carbon atoms; and n represents an integer of 1 or more.

[Formula 19]

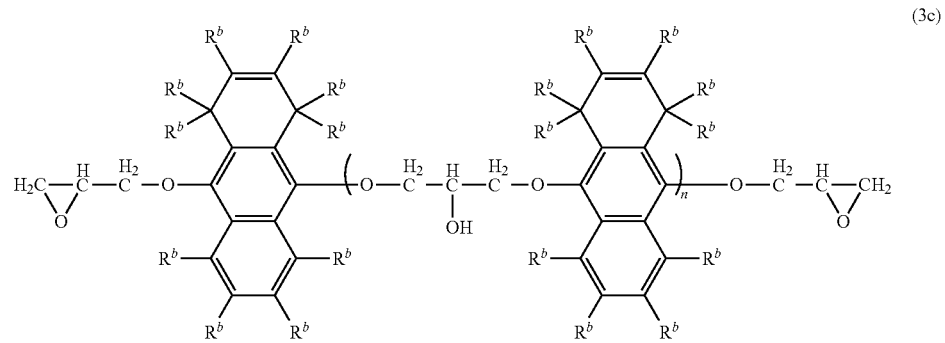

(3c)

wherein $R^b$ each independently represents a hydrogen atom or an alkyl group having 1 to 7 carbon atoms; and n represents an integer of 1 or more.

[Formula 20]

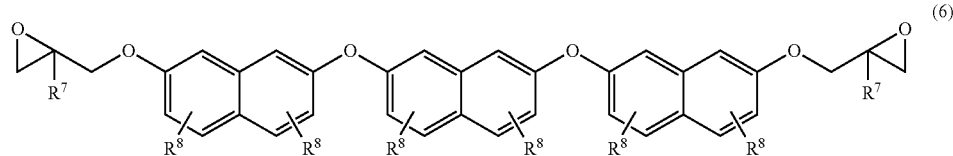

(6)

wherein $R^7$ each independently represents a hydrogen atom or a methyl group, and $R^8$ each independently represents a hydrogen atom, an alkyl group having 1 to 4 carbon atoms, or an aralkyl group represented by the above general formula (4).

[Formula 21]

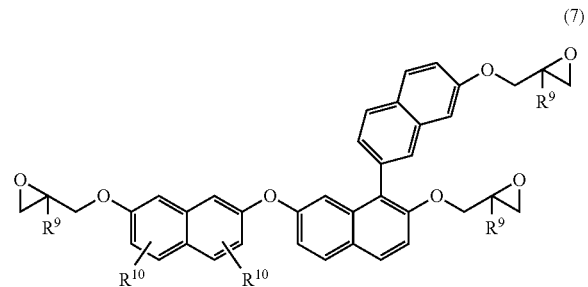

(7)

wherein $R^9$ each independently represents a hydrogen atom or a methyl group, and $R^{10}$ each independently represents a hydrogen atom, an alkyl group having 1 to 4 carbon atoms, or an aralkyl group represented by the above general formula (4).

One of these epoxy resins can be used alone or two or more of these epoxy resins can be used in appropriate combination according to the purpose. Particularly, it is preferred to use a biphenyl aralkyl-based epoxy resin represented by the above general formula (2b), and an epoxy resin represented by the above general formula (6) and/or an epoxy resin represented by the above general formula (7) in combination, in terms of achieving both flame retardancy and a thermal expansion coefficient.

The content of the epoxy resin (B) in the resin composition can be appropriately set according to the intended application and performance, and is not particularly limited. In terms of the curability of the resin composition, and the heat resistance and thermal expansion coefficient of the cured product thereof, the content of the epoxy resin (B) is preferably 5 to 60 parts by mass, more preferably 10 to 40 parts by mass, based on 100 parts by mass of the total of the resin solid components.

For the curing agent (C) used in the resin composition in this embodiment, a known one can be appropriately used as long as it is one that cures the above epoxy resin (B). The type of the curing agent (C) is not particularly limited. For example, in prepreg and laminate applications, those having excellent heat resistance and excellent electrical properties, such as dielectric constant and dielectric loss tangent, are preferred, and specifically, at least one selected from the group consisting of a cyanate ester compound, a phenolic resin, and a BT resin (bismaleimide-triazine resin) is preferred.

As the above cyanate ester compound, a known one can be appropriately used as long as it is a compound represented by the general formula R—O—CN, wherein R is an organic group. The type of the above cyanate ester compound is not particularly limited. Specific examples thereof include, but are not particularly limited to, naphthol aralkyl-based cyanate ester compounds represented by the following general formula (8), 1,3-dicyanatobenzene, 1,4-dicyanatobenzene, 1,3,5-tricyanatobenzene, bis(3,5-dimethyl 4-cyanatophenyl) methane, 1,3-dicyanatonaphthalene, 1,4-dicyanatonaphthalene, 1,6-dicyanatonaphthalene, 1,8-dicyanatonaphthalene, 2,6-dicyanatonaphthalene, 2,7-dicyanatonaphthalene, 1,3,6-tricyanatonaphthalene, 4,4'-dicyanatobiphenyl, bis(4-cyanatophenyl)methane, 2,2'-bis(4-cyanatophenyl)propane, bis(4-cyanatophenyl)ether, bis(4-cyanatophenyl)thioether, bis(4-cyanatophenyl)sulfone, 2,2'-bis(4-cyanatophenyl)propane, bis(3,5-dimethyl, 4-cyanatophenyl)methane, and phenol novolac-based cyanate ester compounds. One of these can be used alone or two or more of these can be used in appropriate combination according to the purpose. Among these, naphthol aralkyl-based cyanate ester compounds represented by the following general formula (8), and phenol novolac-based cyanate ester compounds represented by the following general formula (9) are preferred in terms of increasing flame retardancy.

[Formula 22]

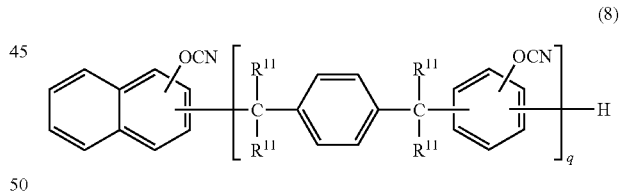

(8)

wherein $R^{11}$ each independently represents a hydrogen atom or a methyl group, and q represents an integer of 1 or more.

[Formula 23]

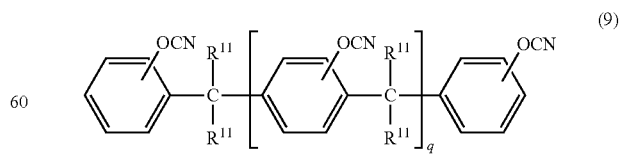

(9)

wherein $R^{11}$ each independently represents a hydrogen atom or a methyl group, and q represents an integer of 1 or more.

In addition, as the above phenolic resin, a known one can be appropriately used as long as it is a resin having two or more phenolic hydroxyl groups in one molecule. The type of the above phenolic resin is not particularly limited. Specific examples thereof include, but are not particularly limited to, cresol novolac-based phenolic resins, phenol novolac resins, alkylphenol novolac resins, bisphenol A-based novolac resins, dicyclopentadiene-based phenolic resins, Xylok-based phenolic resins, terpene-modified phenolic resins, polyvinyl phenols, naphthol aralkyl-based phenolic resins represented by the following general formula (10), biphenyl aralkyl-based phenolic resins represented by the following general formula (11), naphthalene-based phenolic resins, and aminotriazine novolac-based phenolic resins. One of these can be used alone or two or more of these can be used in appropriate combination according to the purpose. Among these, in terms of water absorbency and heat resistance, cresol novolac-based phenolic resins, aminotriazine novolac-based phenolic resins, naphthalene-based phenolic resins, naphthol aralkyl-based phenolic resins, and biphenyl aralkyl-based phenolic resins are preferred, and cresol novolac-based phenol compounds, naphthol aralkyl-based phenolic resins represented by the following general formula (10), and biphenyl aralkyl-based phenolic resins represented by the following general formula (11) are more preferred.

[Formula 24]

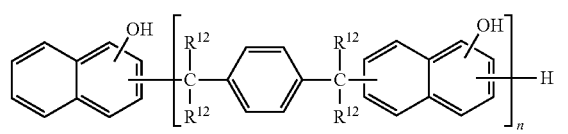

(10)

wherein $R^{12}$ each independently represents a hydrogen atom or a methyl group, and n represents an integer of 1 or more.

[Formula 25]

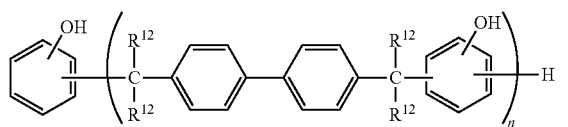

(11)

wherein $R^{12}$ each independently represents a hydrogen atom or a methyl group, and n represents an integer of 1 or more.

Further, as the above BT resin, a known one can be appropriately used as long as it is one obtained by prepolymerization using a maleimide compound and a cyanate ester compound as main components. The type of the above BT resin is not particularly limited. Specific examples thereof include, but are not limited to, one obtained by heating and melting a naphthol aralkyl-based cyanate ester compound represented by the above general formula (8) and bis(3-ethyl-5-methyl-4-maleimidiphenyl)methane (BMI-70: manufactured by K.I Chemical Industry Co., Ltd.) for polymerization reaction, one obtained by heating and melting 2,2-bis(4-cyanatophenyl)propane (CX, manufactured by Mitsubishi Gas Chemical Company. Inc.) and bis(3-ethyl-5-methyl-4-maleimidiphenyl)methane (BMI-70: manufactured by K.I Chemical Industry Co., Ltd.) for polymerization reaction, and one obtained by heating and melting a novolac-based cyanate ester resin (Primaset PT-30, manufactured by Lonza Japan Ltd., cyanate equivalent: 124 g/eq.) and bis(3-ethyl-5-methyl-4-maleimidiphenyl)methane (BMI-70: manufactured by K.I Chemical Industry Co., Ltd.) for polymerization reaction, and then dissolving the polymer in methyl ethyl ketone. One of these can be used alone or two or more of these can be used in appropriate combination according to the purpose. Among these, BT resins comprising naphthol aralkyl-based cyanate ester compounds can be preferably used because of properties such that since the resin skeleton is a rigid structure, heat resistance can be maintained, and reaction-inhibiting factors are decreased to increase curability, and water absorbency and heat resistance are still further increased. One cyanate ester compound, a raw material of a BT resin, can be used alone, or two or more cyanate ester compounds can be appropriately mixed and used.

The content of the curing agent (C) in the resin composition can be appropriately set according to the intended application and performance, and is not particularly limited. In terms of the curability of the resin composition, and the heat resistance and thermal expansion coefficient of the cured product thereof, the content of the curing agent (C) is preferably 10 to 70 parts by mass, more preferably 20 to 50 parts by mass, based on 100 parts by mass of the total of the resin solid components.

When the above phenolic resin is blended as the curing agent (C), it is preferably blended so that the ratio of the number of hydroxyl groups in the phenolic resin to the number of glycidyl groups in the epoxy resin is in the range of 0.7 to 2.5, in terms of maintaining heat resistance and flame retardancy.

As the inorganic filler (D) used in the resin composition in this embodiment, a known one can be appropriately used, and the type of the inorganic filler (D) is not particularly limited. Generally, those used in resin compositions for laminates or for electrical wiring boards can be preferably used. Specific examples thereof include silicas, such as natural silica, fused silica, synthetic silica, amorphous silica, and hollow silica, molybdenum compounds, such as zinc molybdate, ammonium molybdate, molybdenum disulfide, and molybdenum trioxide, boehmite, white carbon, titanium white, AEROSIL, silicone composite powders, silicone resin powders, zinc borate, zinc stannate, alumina, clay, kaolin, talc, fired clay, fired kaolin, fired talc, natural mica, synthetic mica, zinc oxide, magnesium oxide, zirconium oxide, aluminum hydroxide, boron nitride, barium sulfate, E-glass. A-glass, NE-glass, C-glass, L-glass, D-glass, S-glass, M-glass G20, glass short Fibers (including glass fine powders, such as E-glass, T-glass, D-glass, S-glass, and Q-glass), hollow glass, and spherical glass. One of these can be used alone or two or more of these can be used in appropriate combination according to the purpose. The average particle diameter (D50) of the inorganic filler (D) is not particularly limited, and is preferably 0.2 to 5 μm considering dispersibility, drillability, and the like.

The content of the inorganic filler (D) in the resin composition can be appropriately set according to the intended application and performance, and is not particularly limited. In terms of a thermal expansion coefficient and moldability, the content of the inorganic filler (D) is preferably 40 to 600 parts by mass, more preferably 80 to 300 parts by mass, based on 100 parts by mass of the total of the resin solid components. The above-described surface-treated molybdenum compound powder (A) is not included in this inorganic filler (D).

Here, the resin composition in this embodiment may further contain a silane coupling agent or a wetting and dispersing agent as required. By containing a silane coupling agent or a wetting and dispersing agent, the dispersibility of the above-described surface-treated molybdenum compound powder (A) and inorganic filler (D) can be improved. As the silane coupling agent, those generally used for the surface treatment of inorganic matter can be preferably used, and the type of the silane coupling agent is not particularly limited. Specific examples thereof include, but are not particularly limited to, aminosilane-based silane coupling agents, such as γ-aminopropyltriethoxysilane and N-β-(aminoethyl)-γ-aminopropyltrimethoxysilane, epoxysilane-based silane coupling agents, such as γ-glycidoxypropyltrimethoxysilane, vinylsilane-based silane coupling agents, such as γ-methacryloxypropyltrimethoxysilane, cationic silane-based silane coupling agents, such as N-β-(N-vinylbenzylaminoethyl)-γ-aminopropyltrimethoxysilane hydrochloride, and phenylsilane-based silane coupling agents. One silane coupling agent can be used alone, or two or more silane coupling agents can be used in appropriate combination. In addition, as the wetting and dispersing agent, those generally used for paints can be preferably used, and the wetting and dispersing agent is not particularly limited to its type. Specific examples thereof include, but are not particularly limited to, DISPERBYK-110. DISPERBYK-111, DISPERBYK-180, DISPERBYK-161, BYK-W996, BYK-W9010, BYK-W903, BYK-W161, and BYK-W940 manufactured by BYK Japan KK. One wetting and dispersing agent can be used alone, or two or more wetting and dispersing agents can be used in appropriate combination.

In addition, the resin composition in this embodiment may further contain a maleimide compound (E) as required. By containing the maleimide compound (E), the heat resistance tends to be still further increased. As this maleimide compound (E), a known one can be appropriately used as long as it is a compound having one or more maleimide groups in one molecule. The type of the maleimide compound (E) is not particularly limited. Specific examples thereof include, but are not particularly limited to, N-phenylmaleimide, N-hydroxyphenylmaleimide, bis(4-maleimidophenyl)methane, 2,2-bis{4-(4-maleimidephenoxy)-phenyl}propane, bis(3,5-dimethyl-4-maleimidephenyl)methane, bis(3-ethyl-5-methyl-4-maleimidephenyl)methane, bis(3,5-diethyl-4-maleimidephenyl)methane, maleimide compounds represented by the following general formula (12), prepolymers of these maleimide compounds, or prepolymers of maleimide compounds and amine compounds. One maleimide compound (E) can be used alone, or two or more maleimide compounds (E) can be used in appropriate combination. More preferred examples include bis(4-maleimidephenyl)methane, maleimide compounds represented by the following general formula (12), 2,2-bis{4-(4-maleimidephenoxy)-phenyl}propane, bis(3-ethyl-5-methyl-4-maleimidephenyl)methane.

[Formula 26]

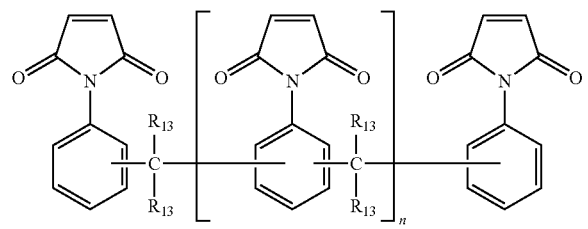

(12)

wherein $R^{13}$ each independently represents a hydrogen atom or a methyl group, and n represents an integer of 1 or more.

The content of the maleimide compound (E) in the resin composition can be appropriately set according to the intended application and performance, and is not particularly limited. In terms of increasing heat resistance and reducing water absorbency, the content of the maleimide compound (E) is preferably 1 to 50 parts by mass, more preferably 5 to 30 parts by mass, based on 100 parts by mass of the total of the resin solid components.

Further, the resin composition in this embodiment may further contain a silicone powder as required. The silicone powder can act as a flame-retardant aid that delays burning time to increase a flame-retardant effect. As this silicone powder, generally known ones can be preferably used, and the type of the silicone powder is not particularly limited. Examples of the general classification of the silicone powder can include a fine powder of polymethylsilsesquioxane in which siloxane bonds are crosslinked in the form of a three-dimensional network, a fine powder of an addition polymer of vinyl group-containing dimethylpolysiloxane and methylhydrogenpolysiloxane, a fine powder of an addition polymer of vinyl group-containing dimethylpolysiloxane and methylhydrogenpolysiloxane whose surface is coated with polymethylsilsesquioxane in which siloxane bonds are crosslinked in the form of a three-dimensional network, and an inorganic support whose surface is coated with polymethylsilsesquioxane in which siloxane bonds are crosslinked in the form of a three-dimensional network. One silicone powder can be used alone, or two or more silicone powders can be used in appropriate combination. The average particle diameter (D50) of the silicone powder is not particularly limited, and is preferably 1 to 15 μm considering dispersibility.

The content of the silicone powder in the resin composition can be appropriately set according to the intended application and performance, and is not particularly limited. In terms of moldability and dispersibility, the content of the silicone powder is preferably 30 parts by mass or less, more preferably 20 parts by mass or less, based on 100 parts by mass of the total amount of the resin solid components blended.

In addition, the resin composition in this embodiment may contain a curing accelerator for appropriately adjusting curing speed, as required. As this curing accelerator, those generally used as curing accelerators for epoxy resins, cyanate ester compounds, and phenolic resins can be preferably used, and the type of the curing accelerator is not particularly limited. Specific examples thereof include, but are not particularly limited to, organometallic salts of copper, zinc, cobalt, nickel, and the like, imidazoles and derivatives thereof, and tertiary amines. One curing accelerator can be used alone, or two or more curing accelerators can be used in appropriate combination.

Furthermore, the resin composition in this embodiment may contain components other than the above in a range in which the desired properties are not impaired. Examples of such optional blending materials include various polymer compounds, such as thermosetting resins, thermoplastic resins, and oligomers thereof, and elastomers, flame-retardant compounds, and various additives, other than the above. These are not particularly limited as long as they are those generally used. Examples of the flame-retardant compounds include bromine compounds, such as 4,4'-dibromobiphenyl, phosphate esters, melamine phosphate, phosphorus-containing epoxy resins, nitrogen-containing compounds, such as melamine and benzoguanamine, oxazine ring-containing compounds, and silicon-based compounds. Examples of the various additives include, but are not particularly limited to, an ultraviolet absorbing agent, an antioxidant, a photopolymerization initiator, a fluorescent brightening agent, a photosensitizer, a dye, a pigment, a thickening agent, a lubricant, a defoaming agent, a dispersing agent, a leveling agent, a brightening agent, and a polymerization inhibitor. One of these optional blending materials can be used alone, or two or more of these optional blending materials can be used in combination.

The resin composition in this embodiment can be prepared according to an ordinary method, and the method for preparing the resin composition in this embodiment is not particularly limited. The resin composition in this embodiment can be easily prepared by stirring and mixing the above-described surface-treated molybdenum compound powder (A), epoxy resin (B), curing agent (C), inorganic filler (D), and the like. During the preparation of this resin composition, known treatment (stirring, mixing, and kneading treatment and the like) for uniformly mixing the components can be performed. The above stirring, mixing, and kneading treatment can be appropriately performed, for example, using a known apparatus, such as an apparatus intended for mixing, such as a ball mill or a bead mill, or a revolution and rotation mixing apparatus. Specific examples of the treatment include a method of blending the surface-treated molybdenum compound powder (A) and the inorganic filler (D) in the epoxy resin (B), dispersing them by a homomixer or the like, and further blending the curing agent (C) therein. Here, during the preparation of the resin composition, it is desired to add an organic solvent in order to decrease viscosity to improve handling properties and increase impregnation properties for glass cloth.

The resin composition in this embodiment may contain an organic solvent as required. In other words, the resin composition in this embodiment can be used as a mode (resin varnish) in which at least part, preferably all, of the above-described components are dissolved in or compatible with an organic solvent. As the organic solvent, a known one can be appropriately used as long as it is one capable of dissolving or making compatible at least part, preferably all, of the epoxy resin (B) and the curing agent (C). The type of the organic solvent is not particularly limited. Specific examples thereof include, but are not particularly limited to, ketones, such as acetone, methyl ethyl ketone, methyl isobutyl ketone, and cyclohexanone, aromatic hydrocarbons, such as benzene, toluene, and xylene, and amides, such as dimethylformamide and dimethylacetamide. One organic solvent can be used alone, or two or more organic solvents can be used in appropriate combination.

(Prepreg)

On the other hand, a prepreg in this embodiment is obtained by combining the above resin composition with a substrate, specifically, impregnating or coating a substrate with the above resin composition. This prepreg can be fabricated according to an ordinary method, and the method for fabricating the prepreg is not particularly limited. For example, the prepreg in this embodiment can be fabricated by impregnating or coating a substrate with a resin varnish obtained by adding an organic solvent to the above resin composition, and then heating the substrate with the resin varnish in a dryer at 100 to 200° C. for 1 to 60 minutes, or the like for semi-curing (B-staging). At this time, the amount of the resin composition adhered to the substrate, that is, the amount of the resin composition (including the surface-treated molybdenum compound powder (A) and the inorganic filler (D)) based on the total amount of the prepreg after the semi-curing, is preferably in the range of 20 to 90% by mass.

The substrate used in the prepreg in this embodiment is not particularly limited, and, for example, known ones used for various printed wiring board materials can be appropriately selected and used depending on the intended application and performance. Specific examples thereof include, but are not particularly limited to, glass fibers, such as E-glass, D-glass, S-glass, NE-glass, T-glass, Q-glass, UN-glass, and spherical glass, inorganic fibers other than glass, organic fibers, such as polyimides, polyamides, and polyesters, or woven fabrics, such as liquid crystal polyesters. One substrate can be used alone, or two or more substrates can be used in appropriate combination. As the shape of the substrate, woven fabrics, nonwoven fabrics, rovings, chopped strand mats, surfacing mats, and the like are known, and as the weave of the woven fabric, plain weave, basket weave, twill weave, and the like are known. The shape of the substrate and the weave of the woven fabric can be appropriately selected and used from these known ones depending on the intended application and performance. In addition, the thickness of the substrate is not particularly limited, and is usually about 0.01 to 0.3 mm, and is, for example, preferably in the range of 0.01 to 0.2 mm in laminate applications. Among these substrates, particularly, glass fibers of E-glass are preferably used in laminate applications because of the balance between the expansion coefficient in the planar direction and drillability.

(Laminate and Metal Foil-Clad Laminate and Printed Wiring Board)

On the other hand, a laminate in this embodiment is obtained by laminating and molding the above-described prepreg. In addition, a metal foil-clad laminate in this embodiment is obtained by laminating and molding the above-described prepreg and metal foil. The metal foil-clad laminate in this embodiment can be fabricated by stacking one or a plurality of the above-described prepregs, disposing metal foil, such as copper or aluminum, on one surface or both surfaces of the stack as desired, and laminating and molding them. The metal foil used here is not particularly limited as long as it is one used for a printed wiring board material. Copper foil, such as rolled copper foil and electrolytic copper foil, is preferred. Considering conductor loss in the high frequency region, electrolytic copper foil having small matte surface roughness is more preferred. In addition, the thickness of the metal foil is not particularly limited, and is preferably 2 to 70 μm, more preferably 2 to 35 μm. As the molding conditions, usual methods for laminates and multilayer boards for printed wiring boards can be applied, and the molding conditions are not particularly limited. For example, molding is generally performed at a temperature in the range of 100 to 300° C. and a surface pressure in the range of 2 to 100 kgf/cm$^2$ with a heating time in the range of 0.05 to 5 hours using a multistage press, a multistage vacuum press, a continuous molding machine, an autoclave molding machine, or the like. For example, a multilayer board can also be provided by disposing 35 μm copper foil on both surfaces of one of the above prepregs, laminating and forming them under the above conditions, then forming inner layer circuits, subjecting the circuits to blackening treatment to form an inner layer circuit board, then alternately disposing the inner layer circuit boards and the above prepregs one by one, further disposing copper foil on the outermost layers, and laminating and molding them under the above conditions preferably under vacuum. In addition, a multilayer board can also be provided by laminating and molding the above prepreg and a separately fabricated wiring board for an inner layer in combination.

The above metal foil-clad laminate in this embodiment can be preferably used as a printed wiring board by forming a predetermined wiring pattern. The metal foil-clad laminate in this embodiment has a low thermal expansion coefficient, high flame retardancy, and good moldability and drillability, and therefore can be especially effectively used as a printed wiring hoard for a semiconductor package for which such performance is required.

The above printed wiring board can be manufactured, for example, by the following method. First, a metal foil-clad laminate, such as the above-described copper-clad laminate, is prepared. Next, a surface of the metal foil-clad laminate is subjected to etching treatment to form an inner layer circuit to fabricate an inner layer hoard. The inner layer circuit surface of this inner layer board is subjected to surface treatment for increasing adhesive strength, as required. Then, the required number of the above-described prepregs are stacked on the inner layer circuit surface, metal foil for an outer layer circuit is further laminated on the outside of the stack, and the laminate is heated and pressurized for integral molding. In this manner, a multilayer laminate in which an insulating layer comprising a substrate and a cured product of a thermosetting resin composition is formed between an inner layer circuit and metal foil for an outer layer circuit is manufactured. Then, this multilayer laminate is subjected to perforation for through holes and via holes, and then, a plated metal film that allows conduction between the inner layer circuit and the metal foil for an outer layer circuit is formed on the wall surface of this hole. Further, the metal foil for an outer layer circuit is subjected to etching treatment to form an outer layer circuit, and a printed wiring board is manufactured.

In this manner, in a printed wiring board comprising an insulating layer and a conductor layer formed on a surface of this insulating layer, the insulating layer can be formed using the resin composition in this embodiment described above. Specifically, for example, in the printed wiring board shown in the above manufacturing example, the prepreg in this embodiment described above (the substrate and the resin composition in this embodiment with which the substrate is impregnated or coated), and the resin composition layer of the metal foil-clad laminate in this embodiment described above (the layer comprising the resin composition in this embodiment) are composed of an insulating layer comprising the resin composition in this embodiment.

As described above, preferred methods for utilizing the resin composition in this embodiment have been described. However, the resin composition in this embodiment is not limited to those described above, and, for example, can also be effectively utilized in electrical insulating materials, sealing materials, adhesives, resist materials, and the like, and its applications are not particularly limited.

EXAMPLES

The present invention will be described in more detail below by giving Examples and Comparative Examples, but the present invention is not limited to these. "Parts" indicates "parts by mass" unless otherwise specified below.

Preparation Example 1

Synthesis of α-Naphthol Aralkyl-Based Cyanate Ester Compound

A reactor to which a thermometer, a stirrer, a dropping funnel, and a reflux condenser were attached was previously cooled to 0 to 5° C. by brine, and was charged with 7.47 g (0.122 mol) of cyanogen chloride, 9.75 g (0.0935 mol) of 35% hydrochloric acid, 76 ml of water, and 44 ml of methylene chloride. While the temperature in this reactor and pH were maintained at −5 to +5° C. and 1 or less, respectively, a solution in which 20 g (0.0935 mol) of α-naphthol aralkyl resin (SN485, hydroxyl group equivalent: 214 g/eq., softening point: 86° C., manufactured by Nippon Steel Chemical Co., Ltd.) and 14.16 g (0.14 mol) of triethylamine were dissolved in 92 ml of methylene chloride was dropped by the dropping funnel over 1 hour with stirring. After the completion of the dropping, 4.72 g (0.047 mol) of triethylamine was further dropped over 15 minutes.

After the completion of the dropping, the mixture was stirred at the same temperature for 15 minutes, and then, the reaction liquid was separated to fractionate the organic layer. The obtained organic layer was washed twice with 100 ml of water, and then, the methylene chloride was distilled off under reduced pressure by an evaporator. Finally, the organic layer was concentrated to dryness at 80° C. for 1 hour to obtain 23.5 g of an α-naphthol aralkyl-based cyanate ester compound represented by the above general formula (8), wherein all $R^{11}$ was a hydrogen atom.

The obtained cyanate ester compound was analyzed by liquid chromatography and an IR spectrum. No raw material peak was detected. In addition, the structure was identified by $^{13}C$-NMR and $^{1}H$-NMR. The conversion rate from a hydroxyl group to a cyanate group was 99% or more.

Example 1

Manufacturing of Zinc Molybdate Whose Surface was Coated with 15 nm Silica 33 g of zinc molybdate (average particle diameter 3 μm, manufactured by NIPPON INORGANIC COLOUR & CHEMICAL CO., LTD.) was dispersed in 100 ml of ethanol in a container, and the liquid temperature of the obtained dispersion was maintained at 55° C. by heating the container in an oil bath. 6 g of silicon tetraethoxide and 6 g of ammonia water (a concentration of 29%) were added to the dispersion, and the mixture was reacted with stirring for 2 hours, and adjusted so that the film thickness was 15 nm after drying and heat treatment. After the reaction, the reaction liquid was diluted and washed with ethanol, and filtered followed by drying at 110° C. for 3 hours using a vacuum dryer. After the drying, heat treatment at 650° C. for 30 minutes was performed using a rotary tube furnace, to obtain a silica-coated zinc molybdate powder. The dispersed state of the obtained silica-coated zinc molybdate powder was very good.

Example 2

Manufacturing of Zinc Molybdate Whose Surface was Coated with 50 nm Silica 10 g of zinc molybdate (average particle diameter 3 μm, manufactured by NIPPON INORGANIC COLOUR & CHEMICAL CO., LTD.) was dispersed in 100 ml of ethanol in a container, and the liquid temperature of the obtained dispersion was maintained at 55° C. by heating the container in an oil bath. 6 g of silicon tetraethoxide and 6 g of ammonia water (a concentration of 29%) were added to the dispersion, and the mixture was reacted with stirring for 2 hours, and adjusted so that the film thickness was 50 nm after drying and heat treatment. After the reaction, the reaction liquid was diluted and washed with ethanol, and filtered followed by drying at 110° C. for 3 hours using a vacuum dryer. After the drying, heat treatment at 650° C. for 30 minutes was performed using a rotary tube furnace, to obtain a silica-coated zinc molybdate powder. The dispersed state of the obtained silica-coated zinc molybdate powder was very good.

Example 3

Manufacturing of Zinc Molybdate Whose Surface was Coated with 30 nm Silica

First, 1 g of 3-glycidoxypropylmethyldimethoxysilane (KBM-403, manufactured by Shin-Etsu Chemical Co., Ltd.) and 3.5 g of silicon tetraethoxide were mixed in a container to prepare a surface treatment agent. Then, 26 ml of water, 10.4 g of 2-propanol, and 0.011 g of phosphoric acid were mixed in a container to prepare a reaction solvent. Next, the above surface treatment agent was introduced into a treatment vessel, and the above reaction solvent and 10 g of zinc molybdate (average particle diameter 3 μm, manufactured by NIPPON INORGANIC COLOUR & CHEMICAL CO., LTD.) were further added. Then, the liquid temperature of the dispersion in the treatment vessel was set to 60° C., the pressure in the treatment vessel was set to 0.05 to 0.06 MPa, and the dispersion was stirred while 2 L of nitrogen per minute was flowed into the treatment vessel. After sufficient stirring, drying was performed by a vacuum dryer, and crushing treatment was further performed followed by drying at 120° C. for 2 hours to obtain a silica-coated zinc molybdate powder. The dispersed state of the obtained silica-coated zinc molybdate powder was very good.

Example 4

Fabrication of Prepreg

25 Parts by mass of a naphthol aralkyl-based phenolic resin (SN-495, manufactured by Nippon Steel Chemical Co., Ltd., hydroxyl group equivalent: 236 g/eq.), 25 parts by mass of a biphenyl aralkyl-based phenolic resin (KAYAHARD GPH-103, manufactured by Nippon Kayaku Co., Ltd., hydroxyl group equivalent: 231 g/eq.), 50 parts by mass of a phenol biphenyl aralkyl-based epoxy resin (NC-3000-FH, epoxy equivalent: 320 g/eq. manufactured by Nippon Kayaku Co. Ltd.). 120 parts by mass of boehmite (APYRAL A01160, manufactured by Nabaltec AG), 1 part by mass of a wetting and dispersing agent (BYK-W903, manufactured by BYK Japan KK), 3 parts by mass of the surface-treated molybdenum compound powder of Example 1 (silica film thickness 15 nm), and 0.03 parts by mass of imidazole (2E4MZ, manufactured by SHIKOKU CHEMICALS CORPORATION) were mixed to prepare a resin composition. The obtained resin composition was diluted with methyl ethyl ketone to provide a resin varnish having a solid concentration of 65 wt %. An E-glass woven fabric having a thickness of 0.1 mm was impregnated and coated with this resin varnish, and heated and dried at 160° C. for 4 minutes to fabricate a prepreg having a resin content of 50% by mass.

<Fabrication of Metal Foil-Clad Laminate>

Four of the obtained prepregs were stacked, and 12 μm thick electrolytic copper foil (3EC-III, manufactured by Mitsui Mining & Smelting Co., Ltd.) was disposed on both surfaces of the obtained laminate. The laminate with the electrolytic copper foil was subjected to vacuum pressing at a pressure of 30 kgf/cm$^2$ and 220° C. for 120 minutes for lamination and molding to fabricate a metal foil-clad laminate (both surface copper-clad laminate) having an insulating layer thickness of 0.4 mm.

Using the obtained metal foil-clad laminate, flame retardancy, heat resistance, thermal expansion coefficient, and drillability were evaluated. The evaluation results of these are shown in Table 1 and Table 2.

The flame retardancy and the thermal expansion coefficient were evaluated by the following methods using the laminate having a plate thickness of 0.4 mm obtained by removing the copper foil of the metal foil-clad laminate by etching. Flame retardancy: The flame retardancy was evaluated according to the UL94 vertical burning test method.

Thermal expansion coefficient: Using a thermomechanical analyzer (manufactured by TA Instruments), the temperature was increased by 10° C. per minute from 40° C. to 340° C., and the linear expansion coefficient in the planar direction at 60° C. to 120° C. was measured. The measurement direction was the longitudinal direction (Warp) of the glass cloth of the laminate.

The heat resistance was evaluated by the following method for the metal foil-clad laminate.

Heat resistance: A sample obtained by cutting the metal foil-clad laminate to 50×50 mm by a dicing saw was used. This sample was floated in a 300° C. solder vessel for 30 minutes, and the time until delamination occurred was measured. A case where no delamination occurred even when 30 minutes elapsed is shown as >30 min in Tables 1 and 2.

The drillability (hole position accuracy) was evaluated under the following drilling conditions.

Four metal foil-clad laminates were stacked and drilled, and the amount of positional displacement of the drilled holes was measured. For this amount of positional displacement, the amount of positional displacement on the back side of the lowest laminate of the four stacked and processed metal foil-clad laminates was measured. The amount of positional displacement of the total number of the processed holes per drill was measured, and the average value of the amount of positional displacement+3σ is shown in the measurement results in Tables 1 and 2 (σ represents a standard deviation value).

Processing machine: ND-1 V212 manufactured by Hitachi Via Mechanics, Ltd.
Number of stacked plates: four metal foil-clad laminates
Entry sheet: LE450 manufactured by Mitsubishi Gas Chemical Company, Inc.
Backup board: PS-1160D manufactured by RISHO KOGYO CO., LTD.
Drill bit: MD MC 0.18×3.3 L508A manufactured by UNION TOOL CO.)
Number of revolutions: 160 krpm
Feed speed: 0.8 m/min
Number of hits: 10000

Example 5

Operation was performed as in Example 4 except that 3 parts by mass of the surface-treated molybdenum compound powder of Example 2 was used instead of 3 parts by mass of the surface-treated molybdenum compound powder of Example 1.

Example 6

Operation was performed as in Example 4 except that 3 parts by mass of the surface-treated molybdenum compound powder of Example 3 was used instead of 3 parts by mass of the surface-treated molybdenum compound powder of Example 1.

Example 7

Operation was performed as in Example 4 except that the amount of the naphthol aralkyl-based phenolic resin (SN- 495, manufactured by Nippon Steel Chemical Co., Ltd., hydroxyl group equivalent: 236 g/eq.) blended was changed to 20 parts by mass, the amount of the biphenyl aralkyl-based phenolic resin (KAYAHARD GPH-103) blended was changed to 20 parts by mass, and 10 parts by mass of bis(3-ethyl-5-methyl-4-maleimidiphenyl)methane (BMI-70, manufactured by K.I Chemical Industry Co., Ltd.) was further blended.

Example 8

Operation was performed as in Example 7 except that 10 parts by mass of a maleimide compound represented by the above general formula (12) (BMI-2300, manufactured by Daiwa Kasei Co., Ltd.) was used instead of 10 parts by mass of bis(3-ethyl-5-methyl-4-maleimidiphenyl)methane (BMI-70, manufactured by K.I Chemical Industry Co., Ltd.).

Example 9

Operation was performed as in Example 4 except that a resin composition obtained by mixing 30 parts by mass of a naphthalene skeleton-based phenolic resin (EPICLON HPC-9500, manufactured by DIC Corporation, hydroxyl group equivalent: 153 g/eq.), 30 parts by mass of a biphenyl aralkyl-based phenolic resin (KAYAHARD GPH-103), 20 parts by mass of a phenol biphenyl aralkyl-based epoxy resin (NC-3000-FH), 20 parts by mass of a polyoxylnaphthylene-based epoxy resin (HP-6000, epoxy equivalent: 277 g/eq.). 1 part by mass of a wetting and dispersing agent (DISPERBYK-161, manufactured by BYK Japan KK), 20 parts by mass of a silicone powder (KMP-605, manufactured by Shin-Etsu Chemical Co., Ltd.), 150 parts by mass of spherical silica (SFP-130MC, manufactured by DENKI KAGAKU KOGYO KABUSHIKI KAISHA), 3 parts by mass of the surface-treated molybdenum compound powder of Example 1 (silica film thickness 15 nm), and 0.03 parts by mass of imidazole (2E4MZ, manufactured by SHIKOKU CHEMICALS CORPORATION) was used instead of the resin composition of Example 4.

Example 10

Operation was performed as in Example 9 except that 3 parts by mass of the surface-treated molybdenum compound powder of Example 2 was used instead of 3 parts by mass of the surface-treated molybdenum compound powder of Example 1.

Example 11

Operation was performed as in Example 4 except that a resin composition obtained by mixing 20 parts by mass of bis(3-ethyl-5-methyl-4-maleimidiphenyl)methane (BMI-70, manufactured by K.I Chemical Industry Co. Ltd.), 40 parts by mass of the α-naphthol aralkyl-based cyanate ester compound of Preparation Example 1 (cyanate equivalent: 261 g/eq.), 40 parts by mass of a phenol biphenyl aralkyl-based epoxy resin (NC-3000-FH), 5 parts by mass of a wetting and dispersing agent (DISPERBYK-161), 120 parts by mass of spherical silica (SFP-130MC), 3 parts by mass of the surface-treated molybdenum compound powder of Example 1 (silica film thickness 15 nm), and 0.012 parts by mass of zinc octylate was used instead of the resin composition of Example 4.

Example 12

Operation was performed as in Example 11 except that 3 parts by mass of the surface-treated molybdenum compound powder of Example 2 was used instead of 3 parts by mass of the surface-treated molybdenum compound powder of Example 1.

Example 13

Operation was performed as in Example 11 except that the blending of bis(3-ethyl-5-methyl-4-maleimidiphenyl)methane (BMI-70) was omitted, the amount of the α-naphthol aralkyl-based cyanate ester compound of Preparation Example 1 (cyanate equivalent: 261 g/eq.) blended was changed to 50 parts by mass, and the amount of the phenol biphenyl aralkyl-based epoxy resin (NC-3000-FH) blended was changed to 50 parts by mass.

Comparative Example 1

Operation was performed as in Example 4 except that the blending of the surface-treated molybdenum compound powder of Example 1 was omitted. It was confirmed that Comparative Example 1 was inferior in hole position accuracy to Example 4.

Comparative Example 2

Operation was performed as in Example 4 except that 3 parts by mass of zinc molybdate was used instead of 3 parts by mass of the surface-treated molybdenum compound powder of Example 1. It was confirmed that Comparative Example 2 was inferior in heat resistance to Example 4.

Comparative Example 3

Operation was performed as in Example 9 except that the blending of the surface-treated molybdenum compound powder of Example 1 was omitted. It was confirmed that Comparative Example 3 was inferior in hole position accuracy to Example 9.

Comparative Example 4

Operation was performed as in Example 9 except that 3 parts by mass of zinc molybdate was used instead of 3 parts by mass of the surface-treated molybdenum compound powder of Example 1. It was confirmed that Comparative Example 4 was inferior in heat resistance to Example 9.

Comparative Example 5

Operation was performed as in Example 11 except that the blending oldie surface-treated molybdenum compound powder of Example 1 was omitted. It was confirmed that Comparative Example 5 was inferior in hole position accuracy to Example 11.

Comparative Example 6

Operation was performed as in Example 11 except that 3 parts by mass of zinc molybdate was used instead of 3 parts by mass of the surface-treated molybdenum compound powder of Example 1. It was confirmed that Comparative Example 6 was inferior in heat resistance to Example 11.

Comparative Example 7

Operation was performed as in Example 4 except that the blending of the surface-treated molybdenum compound powder of Example 1 and boehmite was omitted, and the amount of the wetting and dispersing agent (BYK-W903, manufactured by BYK Japan KK) blended was changed to 1.5 parts by mass. It was confirmed that Comparative Example 7 was inferior in hole position accuracy, thermal expansion coefficient, and flame retardancy to Example 4.

TABLE 1

| | Example 4 | Example 5 | Example 6 | Example 7 | Example 8 | Example 9 | Example 10 | Example 11 | Example 12 | Example 13 |
|---|---|---|---|---|---|---|---|---|---|---|
| Hole position accuracy | 0.025 | 0.025 | 0.025 | 0.025 | 0.025 | 0.025 | 0.025 | 0.025 | 0.025 | 0.025 |
| Thermal expansion coefficient | 11.5 | 11.5 | 11.5 | 11.5 | 11.5 | 9.5 | 9.5 | 10.5 | 10.5 | 10.5 |
| Heat resistance | >30 min | >30 min | >30 min | >30 min | >30 min | >30 min | >30 min | >30 min | >30 min | >30 min |
| Flame retardancy | V-0 | V-0 | V-0 | V-0 | V-0 | V-0 | V-0 | V-0 | V-0 | V-0 |

Unit
Thermal expansion coefficient: ppm/° C.
Hole position accuracy mm

TABLE 2

| | Comparative Example 1 | Comparative Example 2 | Comparative Example 3 | Comparative Example 4 | Comparative Example 5 | Comparative Example 6 | Comparative Example 7 |
|---|---|---|---|---|---|---|---|
| Hole position accuracy | 0.05 | 0.025 | 0.09 | 0.025 | 0.07 | 0.025 | 0.045 |
| Thermal expansion coefficient | 11.5 | 11.5 | 9.5 | 9.5 | 10.5 | 10.5 | 12.5 |
| Heat resistance | >30 | 10 | >30 | 5 | >30 | 10 | >30 |
| Flame retardancy | V-0 | V-0 | V-0 | V-0 | V-0 | V-0 | Complete burning |

Unit
Thermal expansion coefficient: ppm/° C.
Hole position accuracy: mm

As is clear from Tables 1 and 2, it was confirmed that the laminates of Examples 4 to 13 had high heat resistance, a small thermal expansion coefficient, and excellent drillability, and moreover had high flame retardancy even without using a halogen-based flame retardant or a phosphorus compound as a flame retardant. Furthermore, it was confirmed that in the laminates of Examples 4 to 13, all the performance was achieved to a high degree, compared with the laminates of Comparative Examples 1 to 7.

This application claims priority from Japanese Patent Application No. 2011-208981 filed with the Japan Patent Office on Sep. 26, 2011, the content of which is incorporated herein by reference.

INDUSTRIAL APPLICABILITY

As described above, the present invention can be widely and effectively utilized in various applications in which high insulation properties, a low thermal expansion coefficient, high heat resistance, or the like is required, such as electrical and electronic materials, machine tool materials, and aviation materials, for example, electrical insulating materials, semiconductor plastic packages, sealing materials, adhesives, lamination materials, resists, and buildup laminate materials, and can be especially effectively utilized in applications involving machining, such as drilling, polishing, or grinding.

The invention claimed is:

1. A surface-treated molybdenum compound powder having at least part of a surface thereof coated with an inorganic oxide, wherein the inorganic oxide is at least one selected from the group consisting of $SiO_2$, $Al_2O_3$, $TiO_2$, ZnO, $In_2O_3$, $SnO_2$, NiO, CoO, $V_2O_5$, CuO, MgO, and $ZrO_2$.

2. The surface-treated molybdenum compound powder according to claim 1, comprising:
a core particle comprising a molybdenum compound; and
the inorganic oxide formed on at least part of a surface of the core particle.

3. The surface-treated molybdenum compound powder according to claim 1, wherein the molybdenum compound is at least one selected from the group consisting of zinc molybdate, molybdenum trioxide, ammonium molybdate, and a molybdenum hydrate.

4. The surface-treated molybdenum compound powder according to claim 1, wherein the inorganic oxide is at least one selected from the group consisting of silica, titania, alumina, and zirconia.

5. The surface-treated molybdenum compound powder according to claim 1, wherein the inorganic oxide has a thickness of 3 to 500 nm.

6. The surface-treated molybdenum compound powder according to claim 2, wherein the core particle has an average particle diameter of 0.1 to 30 μm.

7. A filler comprising the surface-treated molybdenum compound powder according to claim 1.

8. A resin composition comprising the surface-treated molybdenum compound powder according to claim 1 (A), an epoxy resin (B), a curing agent (C), and an inorganic filler (D).

9. The resin composition according to claim 8, wherein a content of the surface-treated molybdenum compound powder (A) is 0.2 to 30 parts by mass based on 100 parts by mass of a total of resin solid components.

10. The resin composition according to claim 8, wherein the curing agent (C) is at least one selected from the group consisting of a cyanate ester compound, a phenolic resin, and a BT resin.

11. The resin composition according to claim 10, wherein the cyanate ester compound is a naphthol aralkyl-based cyanate ester compound represented by the following general formula (8) and/or a phenol novolac-based cyanate ester compound represented by the following general formula (9):

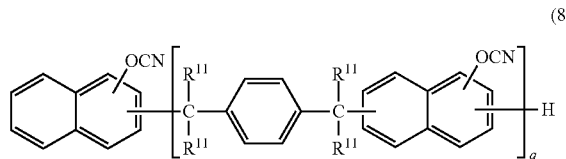
(8)

wherein $R^{11}$ each independently represents a hydrogen atom or a methyl group, and q represents an integer of 1 or more;

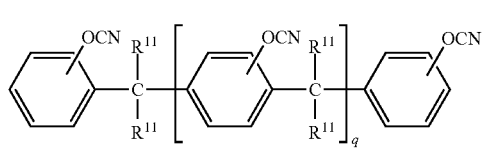
(9)

wherein $R^{11}$ each independently represents a hydrogen atom or a methyl group, and q represents an integer of 1 or more.

12. The resin composition according to claim 10, wherein the phenolic resin is at least one selected from the group consisting of a cresol novolac-based phenolic resin, an aminotriazine novolac-based phenolic resin, a naphthalene-based phenolic resin, a naphthol aralkyl-based phenolic resin represented by the following general formula (10), and a biphenyl aralkyl-based phenolic resin represented by the following general formula (11):

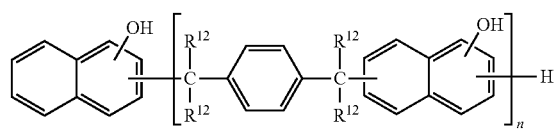
(10)

wherein $R^{12}$ each independently represents a hydrogen atom or a methyl group, and n represents an integer of 1 or more;

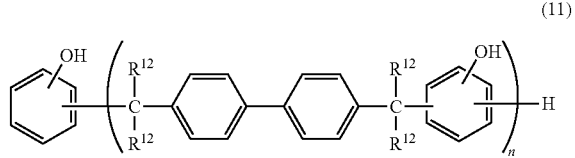
(11)

wherein $R^{12}$ each independently represents a hydrogen atom or a methyl group, and n represents an integer of 1 or more.

13. The resin composition according to claim 12, wherein the phenolic resin is a naphthol aralkyl-based phenolic resin represented by the following general formula (10) and/or a biphenyl aralkyl-based phenolic resin represented by the following general formula (11):

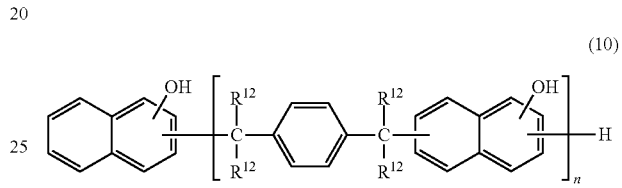
(10)

wherein $R^{12}$ each independently represents a hydrogen atom or a methyl group, and n represents an integer of 1 or more;

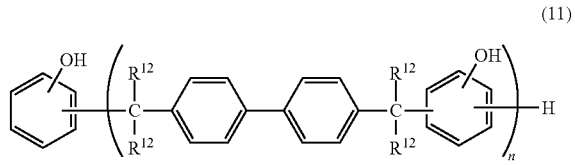
(11)

wherein $R^{12}$ each independently represents a hydrogen atom or a methyl group, and n represents an integer of 1 or more.

14. The resin composition according to claim 8, wherein the epoxy resin (B) is an epoxy resin represented by the following general formula (1) and/or the following general formula (3a):

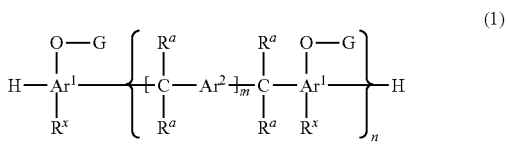
(1)

wherein $Ar^1$ and $Ar^2$ each independently represent an aryl group which is a substituent derived from a monocyclic or polycyclic aromatic hydrocarbon that is a phenyl group, a naphthyl group, or a biphenyl group, $R^a$ each independently represents a hydrogen atom or a methyl group, $R^x$ and $R^y$ each independently represent a hydrogen atom, an alkyl group, or an aryl group, m represents an integer of 1 to 5, n represents an integer of 1 to 50, and G represents a glycidyl group;

(3a)

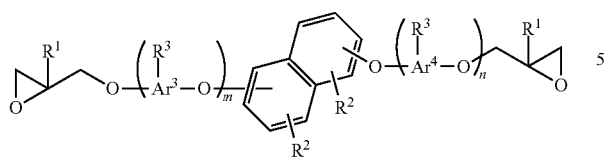

wherein $R^1$ each independently represents a hydrogen atom or a methyl group, $Ar^3$ and $Ar^4$ each independently represent a naphthylene group or a phenylene group, both groups may each have an alkyl group having 1 to 4 carbon atoms or a phenylene group as a substituent, $R^2$ each independently represents a hydrogen atom, an alkyl group having 1 to 4 carbon atoms, or an aralkyl group represented by the following general formula (4), m and n are each independently an integer of 0 to 4 provided that either one of m and n is 1 or more, $R^3$ each independently represents a hydrogen atom, an aralkyl group represented by the following general formula (4), or an epoxy group-containing aromatic hydrocarbon group represented by the following general formula (5), wherein the above general formula (3a), a bonding position to a naphthalene structure part may be either of two benzene rings constituting the naphthalene structure part;

(4)

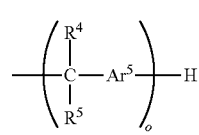

wherein $R^4$ and $R^5$ each independently represent a hydrogen atom or a methyl group, $Ar^5$ represents a phenylene group, a phenylene group or a naphthylene group in which 1 to 3 hydrogen atoms are each nucleus-replaced by an alkyl group having 1 to 4 carbon atoms, or a naphthylene group in which 1 to 3 hydrogen atoms are each nucleus-replaced by an alkyl group having 1 to 4 carbon atoms, and o is a number of 0.1 to 4 on average;

(5)

$$\left( \begin{array}{c} R^6 \\ \triangle \\ O \\ | \\ Ar^6 \end{array} \right)_p - H$$

wherein $R^6$ represents a hydrogen atom or a methyl group, $Ar^6$ represents a naphthylene group or a naphthylene group having an alkyl group having 1 to 4 carbon atoms, an aralkyl group, or a phenylene group as a substituent, and p is an integer of 1 or 2.

15. The resin composition according to claim 8, further comprising a maleimide compound (E).

16. The resin composition according to claim 8, wherein a content of the epoxy resin (B) is 5 to 60 parts by mass based on 100 parts by mass of the total of the resin solid components.

17. The resin composition according to claim 8, wherein a content of the curing agent (C) is 10 to 70 parts by mass based on 100 parts by mass of the total of the resin solid components.

18. A prepreg obtained by impregnating or coating a substrate with the resin composition according to claim 8.

19. A laminate obtained by laminating and molding the prepreg according to claim 18.

20. A metal foil-clad laminate obtained by laminating and molding the prepreg according to claim 18 and a metal foil.

21. A printed wiring board comprising an insulating layer and a conductor layer formed on a surface of the insulating layer, wherein
the insulating layer comprises the resin composition according to claim 8.

\* \* \* \* \*